(12) United States Patent
Hembree et al.

(10) Patent No.: US 6,583,635 B2
(45) Date of Patent: Jun. 24, 2003

(54) SEMICONDUCTOR DIE TEST CARRIER HAVING CONDUCTIVE ELASTOMERIC INTERPOSER

(75) Inventors: David Ries Hembree, Boise, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/810,370

(22) Filed: Mar. 15, 2001

(65) Prior Publication Data
US 2002/0130677 A1 Sep. 19, 2002

(51) Int. Cl.[7] .............................................. G01R 31/02
(52) U.S. Cl. ........................ 324/755; 324/765; 324/756
(58) Field of Search ................................. 324/765, 755, 324/757, 758, 756

(56) References Cited

U.S. PATENT DOCUMENTS

| | | | | |
|---|---|---|---|---|
| 5,408,190 A | * | 4/1995 | Wood et al. | 324/755 |
| 5,440,240 A | * | 8/1995 | Wood et al. | 324/765 |
| 5,825,195 A | * | 10/1998 | Hembree et al. | 324/755 |
| 6,181,567 B1 | * | 1/2001 | Roemer et al. | 174/255 |

* cited by examiner

Primary Examiner—Kamand Cuneo
Assistant Examiner—Tung X. Nguyen
(74) Attorney, Agent, or Firm—Dorsey & Whitney LLP

(57) ABSTRACT

A test carrier and method for testing semiconductor die. The test carrier includes a base containing a cavity into which an anisotropically conductive elastomeric/resilient interposer and interconnector are inserted. A die is then placed in the cavity as the unit under test, and a cover secures the content of the entire cavity. Electrical communication between a die and an external test device is established through the interconnector and the anisotropically elastomeric conductive interposer. The test carrier permits the die to be burned-in and electrically tested prior to assembly.

16 Claims, 3 Drawing Sheets

SEMICONDUCTOR DIE TEST CARRIER HAVING CONDUCTIVE ELASTOMERIC INTERPOSER

TECHNICAL FIELD

This invention relates to electrical test equipment for semiconductor devices. More specifically, the invention relates to an improved apparatus and method for electrically connecting semiconductor die to temporary test carriers used to perform static dynamic burn-in and full electrical testing.

BACKGROUND OF THE INVENTION

Semiconductor die are subjected to a series of test procedures in order to assure quality and reliability. This testing procedure conventionally includes "probe testing" in which individual dice, while still on a wafer, are initially tested to determine functionality and speed. Probe cards are used to electrically test die at that level, and probe cards interface with single or multiple die at a time in wafer. If the wafer has a yield of functional dice that indicates the quality of the functional dice is likely to be good, each individual die is assembled in a package to form a semiconductor device. Conventionally, the packaging includes a lead frame and a plastic or ceramic housing.

These completed semiconductor devices are mated to a test carrier to connect the semiconductor device to various test circuits. The packaged devices are then subjected to another series of tests that include burn-in and electrical testing. Burn-in testing accelerates failure mechanisms by electrically exercising the devices, or units under test (UUT), at elevated temperatures, thus eliminating potential failures that would not otherwise be apparent immediately or at ambient test conditions. Electrical testing includes functional and parametric electrical performance tests of the semiconductor device.

It would also be desirable to permit testing of unpackaged, singulated die in a manner similar to that accomplished with packaged semiconductor devices. Burn-in and electrical testing of unpackaged die would result in reduced material waste, increased profits, and increased throughput. However, such testing requires a significant amount of handling of the unpackaged die. Therefore, with unpackaged die, carriers must be provided to temporarily package the die for testing and certification of known good device (KGD). The test carrier must be compatible with electrical test and burn-in procedures while securing the die without damaging the die at the bondpads or elsewhere during the process.

FIG. 1 shows a conventional test carrier 11 for testing unpackaged semiconductor devices in accordance with the prior art. The test carrier 11 provides a base 13 configured to house a die 21, and to couple the die 21 and the testing device (not shown). The test carrier 11, includes the base 13 with a die receiving cavity 17; a cover 15 for retaining the die 21; and an interconnector 41 for establishing temporary electrical communication between the die 21 and the base 13; and a force applying member (not shown) for biasing the die 21 against the interconnector 41. The interconnector 41 includes contact members (not shown) configured to electrically connect to the die bondpads 27, such as flat or bumped pads. A plurality of external connector leads 33 extends from the base 13. Electrical communication between the enumerated components 11, 13, 21, 33, 41 and the testing device (not shown) is made via a variety of techniques including bondpads and wire bonding (both not shown) and is discussed in detail below.

The test carrier 11 couples the die 21 to a testing device (not shown) having circuitry configured to apply test signals to the die 21. The test device can include a chamber for subjecting the die 21 to temperature cycling during testing, either heated for burn-in testing or cooling for testing below ambient. Test carriers of the type shown in FIG. 1, are shown and described, for example, in U.S. Pat. Nos. 5,302,891, 5,408,190, 5,495,179, 5,519,332, 5,929,647, and 4,899,107, which are incorporated herein by reference.

The test carrier could also permit testing of packaged or semipackaged semiconductor devices.

Still referring to FIG. 1, the interconnector 41 is placed in the base 13 and is electrically connected to conductors (not shown) on the base 13. The semiconductor die is then placed face down in the test carrier 11 and on top of a interconnector 41. Electrical contact is established between die bondpads (not shown) and contacts on the interconnector (not shown) by a biasing force. The interconnector 41 establishes electrical contact between the die 21 and the base 13, and is in electrical communication with conductors (not shown) on the base 13.

Referring now to FIG. 2, the interconnector 41 is used to electrically connect the die 21 to the base 13. The interconnector 41, generally formed of silicon, includes a plurality of raised contacts 43 that establish electrical contact with die bondpads 27 on the die 21. The interconnector 41 also includes a plurality of conductive traces 45 thereon that communicate with respective interconnector bondpads 47 on an upper surface of the interconnector 41. The interconnector bondpads 47 are connected to contact pads 37 by any convenient means such as wire bonding 46.

As shown in FIG. 3, the interconnector 41 establishes temporary electrical communication between the die 21 and the base 13. The plurality of raised contacts 43 on the interconnector establishes electrical contact with the die bondpads 27. The plurality of conductive traces 45 on the interconnector 41 electrically communicates with the respective interconnector bondpads 47. The interconnector bondpads 47 are connected to the contact pads 37 by any convenient means such as wire bonds 46. The contact pads 37 are in electrical communication with the external connector leads 33 via internal connectors 50.

One of the problems encountered with testing of the die 21 in the test carrier 11 is the physical stress caused by the biasing force applied to force the die bondpads 27 against the plurality of raised contacts 43 of the interconnector 41 to ensure a good electrical connection. Establishing a good electrical connection is further complicated by the fact that in many die configurations, the die bondpads 27 are recessed below the surface level of a passivation layer. Moreover, in conventional test carriers, such as test carrier 11, the cover 15 and the inner surface of the base 13, which are biased against opposite surfaces of the die 21, are rigid. However, the surface of the cover 15 and base 21 may not be entirely planar. As a result, localized forces may be exerted against the die 21, causing some of the die bondpads 27 to be in electrical contact with the interconnector 41 and others not. This problem may be exacerbated by differences in thermal expansion between the die 21 and the cover 15 and/or the base 13 during burn-in.

There is, therefore, a need for a test carrier that is capable of testing singulated, unpackaged die without causing it damage, particularly during burn-in testing.

SUMMARY OF THE INVENTION

A test carrier having an elastomeric interposer inserted between an interconnector and a test carrier base for testing unpackaged semiconductor devices is proposed. Such a test carrier precludes having to solder or fix with conductive adhesive the interconnector to the test carrier base, and lessens the amount of biasing force required for KGD testing. Advantages to using a elastomeric interposer include having shorter signal lengths, and the elastomer material of the elastomeric interposer provides a compliant force distribution mechanism for seating the semiconductor in the test bed carrier. The elastomeric interposer material also allows for thinner test carriers.

In a preferred embodiment, an elastomeric interposer is placed between a test carrier and an interconnector to provide an electrical connection between the interconnector and contact pads on the test carrier base. The elastomeric interposer is capable of conforming to the shape of the interconnector and the test carrier base contact pads to sufficiently establish electrical contact. Since the elastomeric interposer also provides a biasing force, less pressure is needed to establish electrical contact, and thereby reduces the risk of damaging a semiconductor die.

In another aspect of the invention, a second elastomeric interposer may be placed between the semiconductor die and the interconnector, in addition to a first elastomeric interposer between the interconnector and the test carrier. In this configuration, the biasing force used to secure the die is transferred through both elastomeric interposers so that potential damage to the die bondpads is further limited.

DETAILED DESCRIPTION OF THE PREFERRED EMBODIMENT

A test carrier apparatus and method for testing semiconductor die will be described. The embodiments are offered not to limit, but only to exemplify and teach concepts of the invention. The embodiments are shown and described in sufficient detail to enable those skilled in the art to implement or practice the invention. Thus, where appropriate to avoid obscuring the invention, the description may omit certain information known to those of skill in the art.

Figure 4:
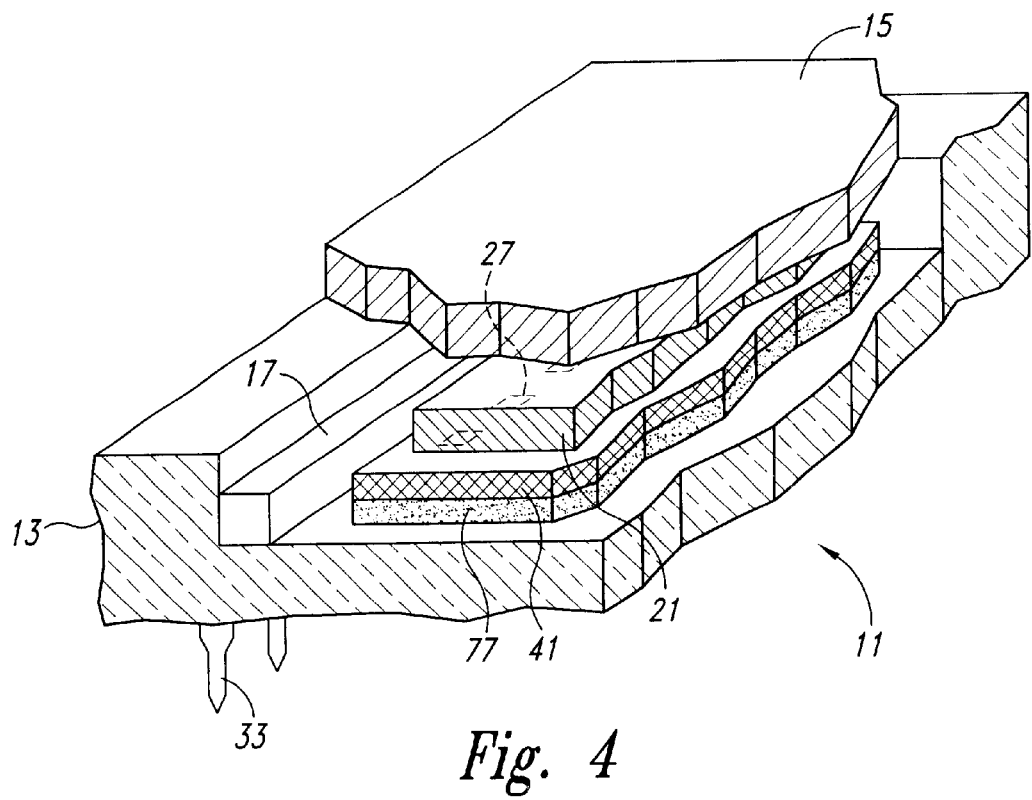
FIG. 4 is an isometric view of a preferred embodiment of the invention at A–A'.

Referring to FIG. 4, a test carrier 11, according to an embodiment of the present invention, includes a base 13 with a die receiving cavity 17; a cover 15 for retaining a die 21; an elastomeric interposer 77; an interconnector 41 for establishing temporary electrical communication between the die 21 and the base 13; and a force applying member (not shown) for biasing the die 21 against the interconnector 41.

As can be seen in FIG. 4, a plurality of external connector leads 33 extends from the base. The external connector leads 33 are shown as connector pins, which preferably are in a dual inline package (DIP) or quad flat pack (QFP) configuration.

Figure 5:
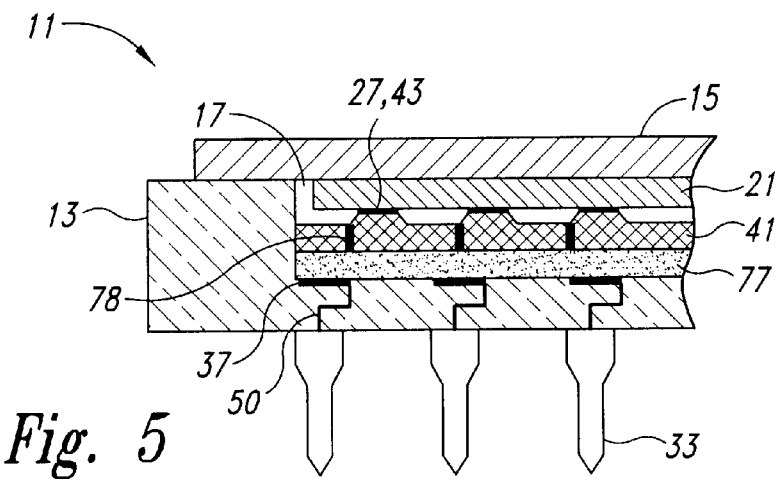
FIG. 5 is a partial cross-sectional view of a preferred embodiment of the invention.

Referring to FIG. 5, the base 13 includes a plurality of contact pads 37 that are in electrical communication with the external connector leads 33 via internal connectors 50.

The interconnector 41 includes vias 78 that are used to electrically connect the die 21 to the elastomeric interposer 77. The interconnector 41 includes a plurality of raised contacts 43 on an upper surface that establish electrical contact with bondpads 27 on the die 21.

The interconnector 41 is preferably formed of silicon. The use of silicon or other semiconductor material for forming the interconnector 41 permits raised contacts 43 and vias 78 to be formed on the interconnector 41 by micromachining along with conventional semiconductor circuit fabrication techniques, such as those used to form conductive lines, vias and bondpads on semiconductor devices. The interconnector 41 may be formed as a rigid, semirigid, semiflexible or flexible material. Where silicon is used as the material for the interconnector 41, it is possible to form the material thin enough that the interconnector 41 is at least semiflexible. In the preferred embodiment, the interconnector 41 is substantially rigid. The rigidity is sufficient that when the interconnector 41 is aligned with the die 21, the height of the raised contacts 43 nearly align with the bondpads 27, and electrical contact is established without significantly distorting the interconnector 41. Typically such contact is achieved at all desired points by allowing the raised contacts 43 to be depressed into the bondpads 27.

The interconnector 41 may also be formed of other semiconductor process materials such as silicon on sapphire (SOS), silicon on glass (SOG), or the like. Alternatively, the interconnector 41 may be formed from a ceramic material. Whether the interconnector 41 is silicon or ceramic, the vias 78 and raised contacts 43 may be made of metal conductors or of any material which has significant conductivity, provided that the conductivity is sufficient to permit electrical testing of the die 21.

Still referring to FIG. 5, the elastomeric interposer 77 functions as an electrical interface between the vias 78 in the interconnector 41 and the contact pads 37 on the base 13. The elastomeric interposer 77 extends to the location of the contact pads 37 on the base 13, so that the bondpads 27 are in electrical communication with the external connector leads 33. The elastomeric interposer 77 is able to elastically deform to establish electrical communication between the contact pads 37 and the vias 78.

The elastomeric interposer 77 is formed from a metal filled polymer composite which is able to function as a compliant, conductive interconnection material. This material is in a group referred to as elastomeric conductive polymer interconnect (ECPI) materials, which are anisotropically conductive in only a single direction. ECPI materials are available from AT&T Bell Laboratories, of Allentown, Pa., or Shin Etsu Polymer America Inc., of Union City, Calif., 3M Company of Minneapolis, Minn., at their Austin, Tex. plant or Nitto Denko America, Inc., San Jose, Calif. (a subsidiary of Nitto Denko Corporation of Japan).

Figure 1:
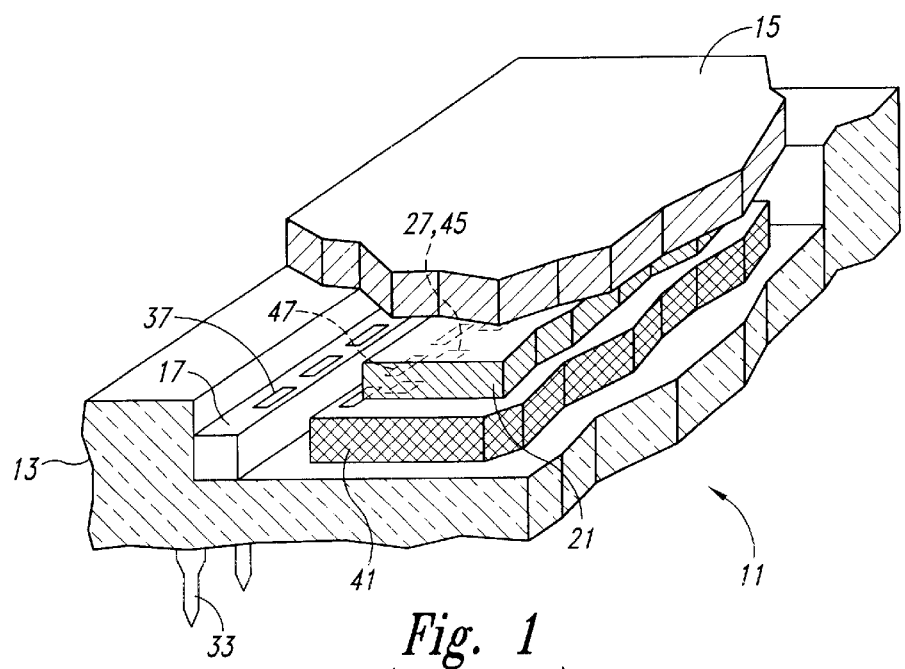
FIG. 1 is an isometric view of a test carrier in accordance with the prior art.
Figure 2:
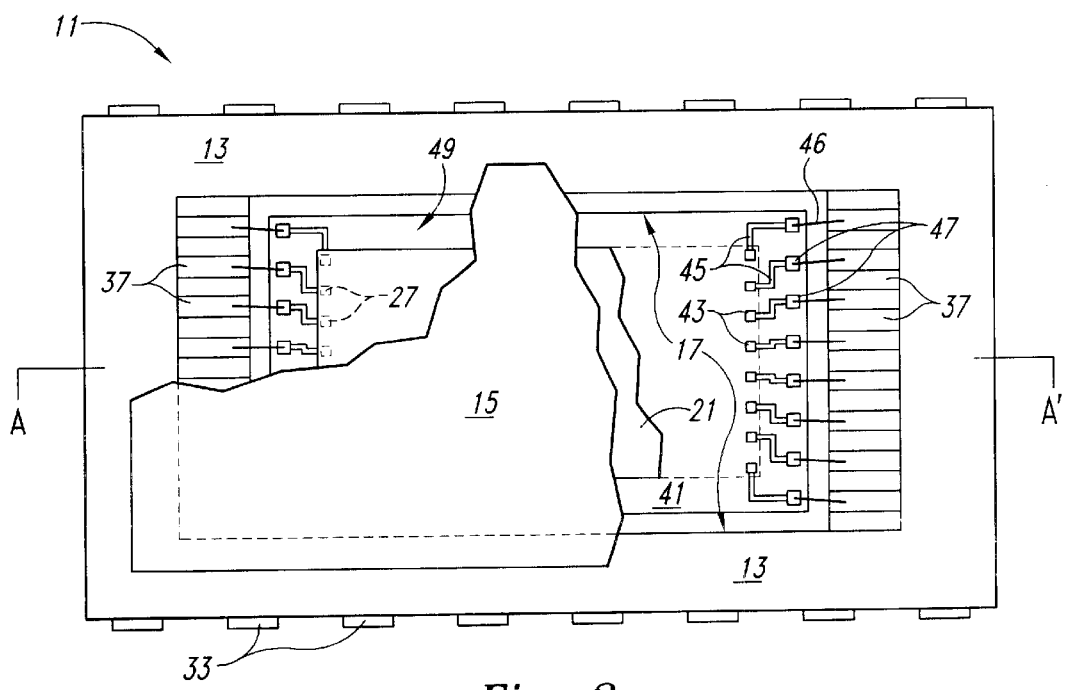
FIG. 2 is a top plan view of a test carrier in accordance with the prior art.
Figure 3:
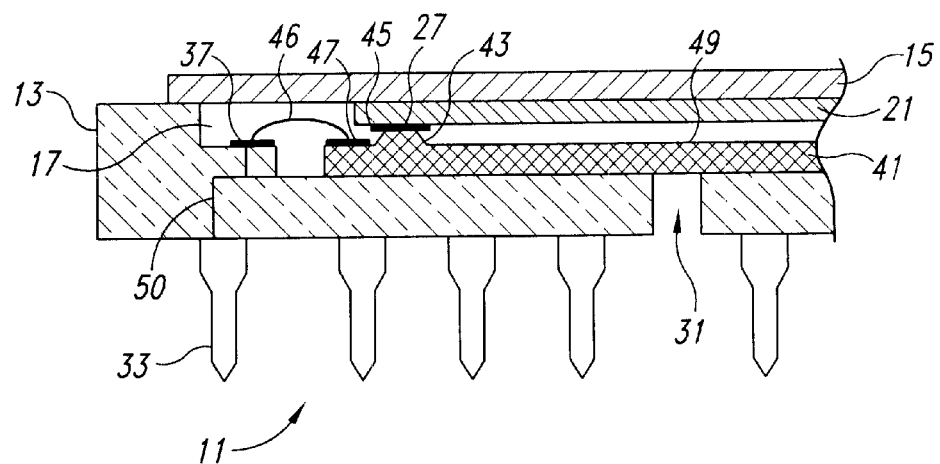
FIG. 3 is a partial cross-sectional view of a test carrier configuration in accordance with the prior art at A–A' of FIG. 2.

Using the elastomeric interposer 77 between the interconnector 41 and the base 13, and consequently, its related contact pads 37, performs several functions. The ability of the elastomeric interposer 77 to resiliently deform permits it to distort sufficiently to reach into the recesses defined by the contact pads 37, and unlike the conventional test carrier 11 illustrated in FIGS. 2 and 3, eliminates the need for wire bonds to connect the interconnector bondpads 47 to the contact pads 37. The compliant nature of the elastomeric interposer 77 permits electrical communication to be made from the die 21 to the contact pads 37 with a minimum of damage to the die 21 and the bondpads 27. This result is important because it is desired that the die 21 and the bondpads 27 remain substantially undamaged subsequent to burn-in and electrical testing. The compliant nature of the elastomeric interposer 77 provides a biasing force to maintain electrical communication between the die 21 and the base 13, despite an intermediate contact member such as the interconnector 41 being slightly misaligned in the die cavity 17.

Significantly, the elastomeric interposer 77 need not be permanently bonded to the base 13 and its related contact pads 37 or the interconnector 41, since electrical contact is established by the biasing force. This enables the elastomeric interposer 77 and interconnector 41 to be lifted from the die cavity 17 without damaging the contact pads 37 on the base 13. However, it will be appreciated that it is also possible to permanently bond the elastomeric interposer 77 to the base 13, and to retain the attachment to the interconnector 41 to the die 21 subsequent to burn-in.

Alternatively, a bumped die with a ball grid array (BGA), also known as a flip chip device, could be tested in lieu of a die 21 with bondpads 27. Using the interposer 77 in this fashion provides the same advantages as described in earlier embodiments.

Figure 6:
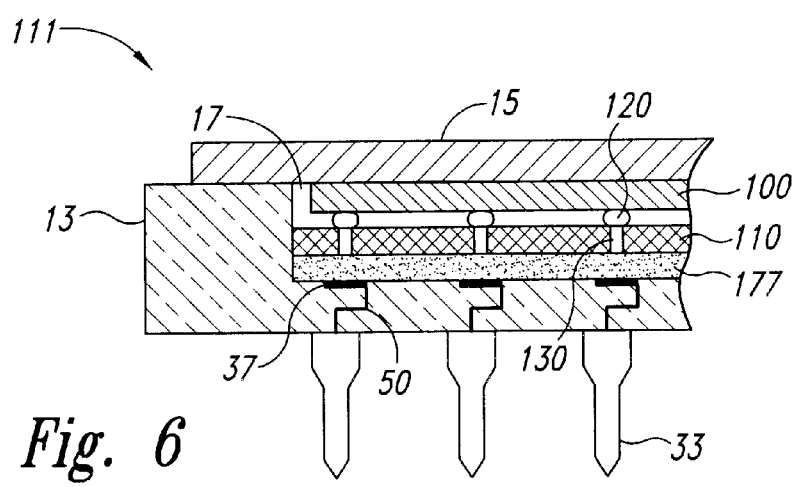
FIG. 6 is a partial cross-sectional view of an alternative embodiment of the invention.

Referring now to FIG. 6, a test carrier 111, according to an alternative embodiment is depicted. As shown, a BGA die 100 having solder bumps 120 is the unit under test in combination with a "pogo pin" type interconnector 110, or any other type of pin contactor. By elastically deforming, an elastomeric interposer 177 establishes electrical contact between solder bumps 120 and contact pads 37. When a biasing force is applied, the solder bumps 120 depress conductive pins (not shown) positioned inside columns 130 into the elastomeric interposer 177 to establish electrical contact with the contact pads 37. Again, the advantages of using the elastomeric interposer 177 over conventional methods are as previously described.

Figure 7:
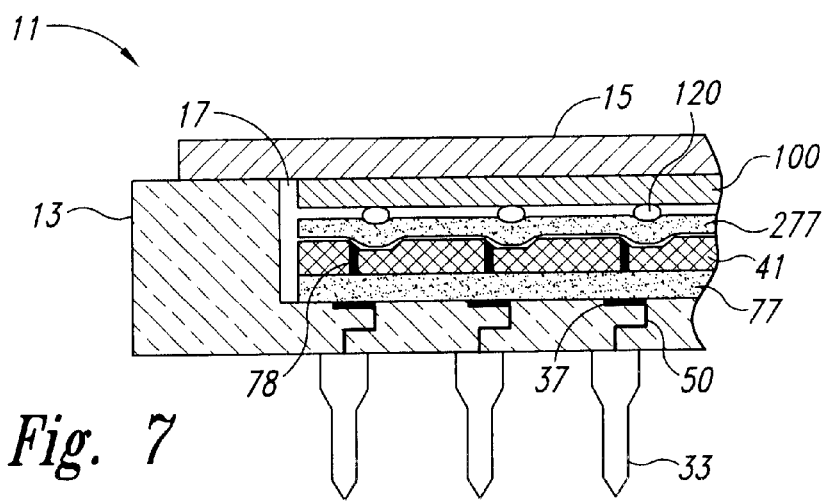
FIG. 7 is a partial cross-sectional view of an alternative embodiment of the invention.

FIG. 7 shows using a second elastomeric interposer 277 between a die 100 and the interconnector 41, as described in co-pending U.S. patent application Ser. No. 8/947,087, filed Oct. 8, 1997 (Micron Docket No. 91-62.19), which is incorporated herein by reference. The die 100 shown in FIG. 7 has a ball grid array ("BGA") interconnections to form a "flip-chip" die. Other advantages of including a second elastomeric interposer 277 between the die 100 and the interconnector 41 result from the elastomeric interposer 277 being easily replaced when sequentially testing different die 100 in the same package, and further reducing the risk of damage to the die 100 due to the elastomeric resiliency of the elastomeric interposer 277. Using the interposer 277 in this fashion also permits testing the die 100.

The invention may also be used for testing packaged and semipackaged semiconductor devices. It is anticipated that other package configurations may be used, including leads over chip (LOC), including pin grid array (PGA), leadless chip carrier (LCC), and molded carrier ring (MCR) packages, as well as other package types. It is also likely that specialized package types could be used.

In each of the above examples, the assembled fixture is adapted for testing with conventional test equipment, such as with a burn-in socket. Clearly, modification to the existing apparatus can be made within the scope of the invention. Accordingly, the invention should be read only as limited by the claims.

What is claimed is:

1. A testing apparatus for testing a semiconductor integrated circuit device, comprising:
   a base capable of receiving a semiconductor integrated circuit device, the base comprised of a plurality of contacts in electrical communication with a plurality of internal conductors, the internal conductors in electrical communication with a plurality of external contacts and capable of electrical connection to test circuitry;
   an elastically resilient pad that is electrically conductive normal to the plane of the pad, the elasticity resilient pad providing electrical isolation across the plane of the pad, the pad being positioned over the base resulting in a portion of the pad establishing electrical communication between the plurality of contacts on the base and a surface of the pad;
   an interconnect comprising a die attachment surface having a plurality of raised contacts on a first surface and configured to electrically engage contacts on the semiconductor integrated circuit device, the interconnect further comprising vias in electrical communication with contacts extending between the first surface and a second surface;
   a cover; and
   a force applying mechanism for securing the semiconductor integrated circuit device to the interconnect and pressing the semiconductor integrated circuit device, the interconnect, the pad, and the base together.

2. The testing apparatus of claim 1, further comprising a second elastically resilient pad that is electrically conductive normal to the plane of the pad, the pad providing electrical isolation across the plane of the pad and being positioned between the interconnect and the semiconductor integrated circuit device so that a portion of the pad establishes electrical communication between the interconnect and the semiconductor integrated circuit device.

3. The test apparatus of claim 1, wherein the semiconductor integrated circuit device comprises a semiconductor integrated circuit die.

4. The testing apparatus of claim 1, wherein the interconnect is substantially rigid.

5. The testing apparatus of claim 1, wherein the interconnect is formed of silicon.

6. The testing apparatus of claim 1, wherein the elastically resilient pad is formed from a metal filled polymer composite.

7. A test system for testing a semiconductor integrated circuit device in die form, comprising:
   a testing apparatus comprising:
      a semiconductor die receiving base comprising a plurality of contacts in electrical communication with a plurality of internal conductors, the internal conductors in electrical communication with a plurality of external contacts to electrical connect to test circuitry;
      an interconnect comprising a die attachment surface having a plurality of raised contacts on a first surface configured to electrically engage contacts on the die and vias in electrical communication with the raised contacts on the first surface;
   a cover, and
      a force applying mechanism to secure the die to the interconnect by pressing the die, the interconnect, the pad, and the base together; and
   an elastically resilient pad that is electrically conductive normal to the plane of the pad and electrically insulating across the plane of the pad, the pad being positioned over the base, so that a portion of the pad establishes electrical communication between the plurality of contacts on the base and the upper surface of the pad; and a die test device coupled to the testing apparatus.

8. The test system of claim 7, further comprising a second elastically resilient pad that is electrically conductive normal to the plane of the pad and electrically isolating across the plane of the pad, the pad being positioned between the interconnect and the die so that a portion of the pad establishes electrical communication between the interconnect and the die.

9. The test system of claim 7, wherein the interconnect is substantially rigid.

10. The test system of claim 7, wherein the interconnect is formed of silicon.

11. The test system of claim 7, wherein the elastically resilient pad is formed from a metal filled polymer composite.

12. A method of testing a semiconductor integrated circuit device in die form, comprising:

providing a base capable of receiving a semiconductor die comprising a plurality of contacts in electrical communication with a plurality of internal conductors, the internal conductors in electrical communication with a plurality of external contacts to electrically connect to test circuitry;

placing a first elastically resilient pad over the base, the first elastically resilient pad being electrically conductive normal to the plane of the pad and being electrically isolating across the plane of the pad, a portion of the first elastically resilient pad being in electrical communication with the plurality of contacts on the base and the upper surface of the pad;

placing a interconnect on the first elastically resilient pad, the interconnect comprising a die attachment surface having a plurality of raised contacts on one surface and vias in electrical communication with the raised contacts;

placing a die on the interconnect having contacts, the contacts being in electrical communication with the raised contacts on the one surface of the interconnect;

placing a cover over the die and enclosing the die within the base; and applying a biasing force for securing the die to the interconnect thereby pressing the die, the interconnect, the first elastically resilient pad, and the base together.

13. The method of claim 12, further comprising placing a second elastically resilient pad between the die and the interconnect, the second elastically resilient pad being electrically conductive to the plane of the pad and being electrically isolating across the plane of the pad, so that a portion of the pad is in electrical communication with the plurality of contacts on the die and the interconnect.

14. The method of claim 12, wherein placing a interconnect on the first elastically resilient pad comprises placing a substantially rigid interconnect on the first elastically resilient pad.

15. The method of claim 12, wherein placing a interconnect on the first elastically resilient pad comprises placing an interconnect formed of silicon on the first elastically resilient pad.

16. The method of claim 12, wherein placing a first elastically resilient pad over the base comprises placing an elastically resilient pad formed from a metal filled polymer composite over the base.

* * * * *